(12) United States Patent
Komuro

(10) Patent No.: US 7,665,209 B2
(45) Date of Patent: Feb. 23, 2010

(54) METHOD MANUFACTURING WIRING SUBSTRATE

(75) Inventor: Yoshiaki Komuro, Kanagawa (JP)

(73) Assignee: Sony Corporation, Tokyo (JP)

(*) Notice: Subject to any disclaimer, the term of this patent is extended or adjusted under 35 U.S.C. 154(b) by 20 days.

(21) Appl. No.: 11/969,273

(22) Filed: Jan. 4, 2008

(65) Prior Publication Data

US 2008/0127489 A1 Jun. 5, 2008

Related U.S. Application Data

(62) Division of application No. 11/064,495, filed on Feb. 23, 2005.

(30) Foreign Application Priority Data

Feb. 25, 2004 (JP) ............................... 2004-049132

(51) Int. Cl.
*H01K 3/10* (2006.01)
(52) U.S. Cl. ............................ 29/852; 29/846; 174/262; 257/508
(58) Field of Classification Search ................ 29/831, 29/832, 846, 852, 887; 174/260, 262; 257/397, 257/506, 508, 510, 698, 700, 778
See application file for complete search history.

(56) References Cited

U.S. PATENT DOCUMENTS

| | | | | |
|---|---|---|---|---|
| 5,477,933 A | * | 12/1995 | Nguyen | ...................... 174/262 |
| 6,606,237 B1 | | 8/2003 | Naito et al. | |
| 6,750,516 B2 | * | 6/2004 | Hartwell | ...................... 257/506 |
| 6,764,931 B2 | | 7/2004 | Iijima et al. | |
| 2004/0119130 A1 | | 6/2004 | Peichi et al. | |

FOREIGN PATENT DOCUMENTS

| | | |
|---|---|---|
| JP | 2001-102479 | 4/2001 |
| JP | 2005-086036 | 3/2005 |

OTHER PUBLICATIONS

Japanese Office Action issued on Dec. 18, 2007 corresponding to JP 2004-049132.

* cited by examiner

*Primary Examiner*—Donghai D. Nguyen
(74) *Attorney, Agent, or Firm*—Sonnenschein Nath & Rosenthal LLP

(57) ABSTRACT

There is provided a wiring substrate for connecting a mounting board on one surface thereof and mounting an integrated circuit chip on the opposite surface to the surface. The wiring substrate has a conductive connecting portion penetrating the substrate for connecting to at least a portion of a wiring layer of the integrated circuit chip, with the portion of a wiring layer formed on the substrate, and an insulating portion formed at a lateral side of the connecting portion for surrounding the connecting portion via a portion of the wiring substrate.

4 Claims, 12 Drawing Sheets

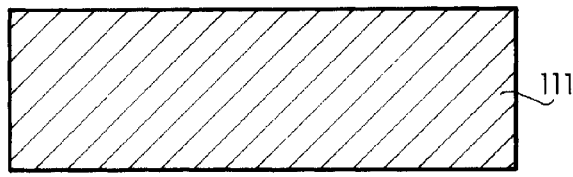
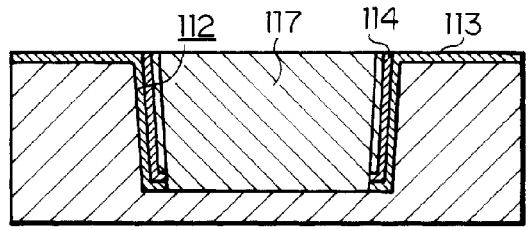
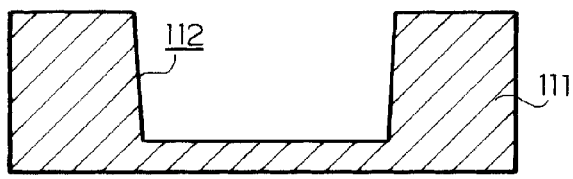
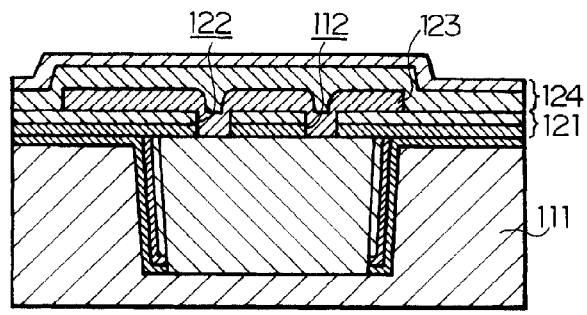
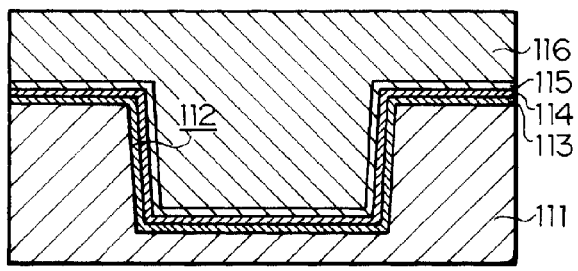

METHOD MANUFACTURING WIRING SUBSTRATE

RELATED APPLICATION DATA

This application is a divisional of U.S. patent application Ser. No. 11/064,495, filed Feb. 23, 2005, the entirety of which is incorporated herein by reference to the extent permitted by law. The present application also claims priority to Japanese Patent Application No. 2004-049132 filed in the Japanese Patent Office on Feb. 25, 2004, the entirety of which also is incorporated by reference herein to the extent permitted by law.

BACKGROUND OF THE INVENTION

1. Field of the Invention

The present invention relates to a wiring substrate provided with a semiconductor integrated circuit chip connected to a mother board, which has high connecting reliability and light load in manufacturing steps. The invention also relates to a method of manufacturing a wiring substrate, and a semiconductor device using the wiring substrate.

2. Description of Related Art

There is disclosed a semiconductor integrated circuit device provided with a semiconductor integrated circuit chip, and an intermediate substrate electrically connected to the semiconductor integrated circuit chip, in which at least a portion of a wiring layer of the semiconductor integrated circuit chip is formed (see, for example, un-examined Japanese Patent Application Publication No. 2001-102479).

Specifically, this publication states:

There are provided with a semiconductor integrated circuit chip, and a substrate electrically connected to the semiconductor integrated circuit chip, in which at least a portion of a wiring layer of the semiconductor integrated circuit chip is formed.

A first layer wiring layer 21 is connected to a via 27 formed in a silicon substrate 20. The via 27 penetrates the silicon substrate 20, and functions as a connecting terminal with an LSI chip 1, for example.

A copper (Cu) film 49 having a thickness of 15 μm is formed as wiring material in the via.

An insulating film 45 consisting of a laminate layer of SiN/SiO$_2$ is formed on the substrate 20 by CVD method. The insulating film 45 functions as a film for insulating the substrate 20 and the via 27 formed later in a via hole 43.

In addition, the necessity of this semiconductor integrated circuit device is stated in detail in the description of prior art in this publication.

An example of a method of manufacturing a conventional semiconductor integrated circuit device will next be described with reference to FIGS. 6A to 6J, which illustrate a general manufacturing process of a silicon interposer of system-in-package (hereinafter referred to simply as "SiP").

As shown in FIG. 6A, a silicon substrate 111 is prepared. As shown in FIG. 6B, a hole 112 having a depth of several hundreds μm and a diameter of several tens μm to several hundreds μm is formed in the silicon substrate 111 by photolithography technique, dry etching technique, and the like.

As shown in FIG. 6C, an insulating film 113, a barrier metal layer 114, a shield copper layer 115 are formed sequentially on the surface of the silicon substrate 111, including the inner surface of the hole 112. A copper plated layer 116 is then formed so as to bury the hole 112.

As shown in FIG. 6D, the excessive conductive films of the copper plated layer 116, the shield copper layer 115, and the barrier metal layer 114 on the surface of the silicon substrate 111 are removed by chemical mechanical polishing (hereinafter referred to as "CMP"), or the like. As a result, a connecting portion 117 composed of copper is formed at the inside of the hole 112 via the barrier metal layer 114 and the insulating film 113.

As shown in FIG. 6E, an insulating film 121 is formed on the surface of the silicon substrate 111, and a connecting hole 122 is opened in the insulating film 121 by photolithography technique and dry etching technique etc., and thereafter a wiring layer 123 is formed. The wiring layer 123 is used for joining to a semiconductor transistor circuit, which will not be described herein, and for forming a wiring circuit. The wiring layer 123 is obtainable by forming a wiring metal layer and patterning the wiring metal layer by photolithography technique and dry etching technique, etc. Subsequently, a protection insulting film 124 for coating the wiring layer 123 is formed.

As shown in FIG. 6F, the silicon substrate 111 is upside down, and adhered to a support board 132 with adhesive 131.

As shown in FIG. 6G, by grinding and polishing techniques, the bottom surface of the silicon substrate 111 is removed in a thickness of several hundreds μm, thereby to expose the copper connecting portion 117.

As shown in FIG. 6H, the bottom surface of the silicon substrate 111 except for the exposed connecting portion 117 is covered with an insulating film 141. For example, a polyimide film is used as the insulating film 141. Thereafter, an opening portion 142 is formed above the connecting portion 117 by photolithography technique.

As shown in FIG. 6I, a solder bump 151 connected to the connecting portion 117 is formed through the opening portion 142.

As shown in FIG. 6J, a silicon interposer 100 is separated individually by dicing, and joined to a mother board 200 with the solder bump 151.

The problem to be solved by the invention is that there is usually hole depth variation when forming a hole in a silicon substrate. This variation causes the disadvantage in the step of exposing the copper connecting portion 117, as described with reference to FIG. 6G. As shown in FIG. 7A, the connecting portion 117 is normally formed so as to project from the bottom surface of the silicon substrate 111. However, if the depth of the hole 112 is small, the copper connecting portion 117 may not be exposed from the bottom surface of the silicon substrate 111, as shown in FIG. 7B. If the amounts of back grinding and CMP (polishing) are increased to expose the connecting portion 117, as shown in FIG. 7C, the connecting portion 117 and the silicon substrate 111 are thinned due to the occurrences of erosion and dishing etc., which can cause the problem of undesired gaps, and the like.

The aim of forming a polyimide film before forming a bump is as follows. As shown in FIG. 6J, in joining the silicon interposer 100 to the mother board 200, if the forming position of the solder bump 151 deviates from the connecting portion 117, as shown in FIG. 8, the deformed solder bump 151 makes contact with the silicon substrate 111, thereby causing electrical continuity between the solder bump 151 and the silicon substrate 111 in some cases. Hence, to prevent the electrical continuity between the silicon substrate 111 and the connecting portion 117 due to the solder bump 151, it is necessary to form the insulating film 141 composed of the polyimide film, as described with reference to FIG. 6H. Therefore, the conventional technique suffers from the problem of increasing the number of manufacturing steps.

SUMMARY OF THE INVENTION

Consequently, according to an embodiment of the present invention, there is provided a wiring substrate for connecting a mounting board on one surface thereof and mounting an integrated circuit chip on the opposite surface to the one surface. The wiring substrate includes a conductive connecting portion penetrating the wiring substrate for connecting to at least a portion of a wiring layer for the integrated circuit chip, with the portion of a wiring layer formed on the wiring substrate; and an insulating portion formed at a lateral side of the connecting portion for surrounding the connecting portion via a portion of the wiring substrate.

Even when a bump is deformed at the time of joining to the mother board, and the bump extends beyond the connecting portion, the insulating portion surrounding the side of the connection portion avoids a connection between the bump and the portion of the substrate which is on the outside of the insulating portion. This eliminates the necessity of a polyimide film as has been formed in the conventional technique. Hence, there is no need for the step relating to the polyimide film, thus permitting a reduction in the number of manufacturing steps.

Further, in a case where the hole depth variation occurs when a hole for forming the connecting portion is formed in a substrate, the insulating portion can be used as a polishing stopper. This allows for a greater grinding amount for exposing the connecting portion formed in the substrate than the conventional conditions, thus assuring that the connecting portion is exposed completely from the substrate. This eliminates the disadvantage that the connecting portion may not be exposed. Hence, there is the advantage of obtaining the wiring substrate of high reliability.

In addition, the problems that the substrate is thinned, and an undesired gap occurs due to erosion and dishing involved in a longer grinding time can be solved by having the insulating portion function as a polish stopping mechanism to suppress the occurrences of erosion and dishing etc. This is due to the fact that polishing rate is generally lower in the insulating portion (e.g., an oxidation film and a nitride film) than that in a conductive material formed at the connecting portion.

According to another embodiment of the present invention, there is provided a method for manufacturing a wiring substrate for connecting a mounting board on one surface thereof and mounting an integrated circuit chip on the opposite surface to the one surface. The method includes the steps of: forming a hole to provide a conductive connecting portion penetrating the wiring substrate for connecting to at least a portion of a wiring layer for the integrated circuit chip, with the portion of a wiring layer formed on the wiring substrate; forming a recess portion at the side of the hole for forming the connecting portion so as to surround the side of the hole via a portion of the wiring substrate, when the hole is formed in the wiring substrate; and forming an insulating portion at the recess portion when the connecting portion is provided in the hole.

Even if the hole depth variation occurs when a hole for forming the connecting portion is formed in a substrate, by virtue of the step of forming the recess portion and the step of forming the insulating portion, the grinding amount for exposing the connecting portion formed in the substrate can be increased than the conventional conditions, thus assuring that the connecting portion is exposed completely from the substrate. This eliminates the disadvantage that the connecting portion may not be exposed.

Further, the problems that the substrate is thinned, or an undesired gap occurs due to erosion and dishing involved in a longer grinding time can be solved by having the insulating portion function as a polish stopping mechanism to suppress the occurrences of erosion and dishing etc. This is due to the fact that polishing rate is generally lower in the insulating portion (e.g., an oxidation film and a nitride film) than that in a conductive material formed at the connecting portion.

Furthermore, in a case where, when the wiring substrate formed by the manufacturing method of the present invention is joined to a mother board, a bump is deformed and extends beyond the connecting portion, the insulating portion surrounding the side of the connecting portion avoids that the bump and the portion of the substrate which is on the outside of the insulating portion may be connected to each other. This eliminates the necessity of the step of forming a polyimide film, and the step of forming an opening of the polyimide film, thus reducing the number of manufacturing steps.

According to further another embodiment of the present invention there is provided a semiconductor device having a wiring substrate for connecting a mounting board on one surface thereof and mounting an integrated circuit chip on the opposite surface to the one surface. The wiring substrate includes: a conductive connecting portion penetrating the wiring substrate for connecting to at least a portion of a wiring layer for the integrated circuit chip, with the portion of a wiring layer formed on the wiring substrate; and an annular insulating portion formed at a lateral side of the connecting portion for surrounding the connecting portion via a portion of the wiring substrate.

There is the advantage that the use of the wiring substrate of the invention enables the operational effect of the wiring substrate. This leads to the advantage of obtaining the semiconductor device exhibiting high connecting reliability between the mounting board and the integrated circuit chip.

Further features of the invention, and the advantages offered thereby, are explained in detail hereinafter, in reference to specific embodiments of the invention illustrated in the accompanying drawings.

BRIEF DESCRIPTION OF THE DRAWINGS

FIGS. 6A to 6J are explanatory drawings showing a conventional manufacturing method and a mounting method of a wiring substrate;

DESCRIPTION OF THE PREFERRED EMBODIMENTS

The aims of obtaining high reliability in joining to a mother board, and reducing manufacturing steps than conventional ones can be realized by forming an insulating portion on a substrate so as to surround the side of a connecting portion via a portion of the substrate, without throwing load on the manufacturing steps.

Example 1

Figure 1A:
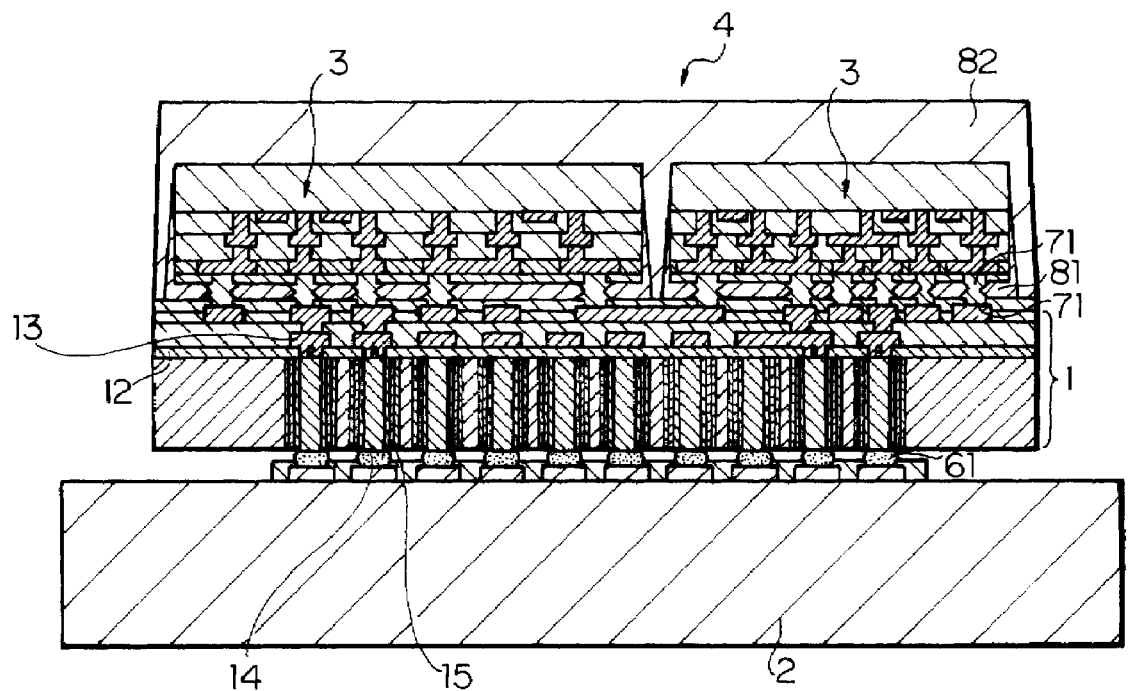
FIGS. 1A and 1B are schematic structural sectional views showing one preferred embodiment of a wiring substrate and a semiconductor device in the present invention.
Figure 1B:
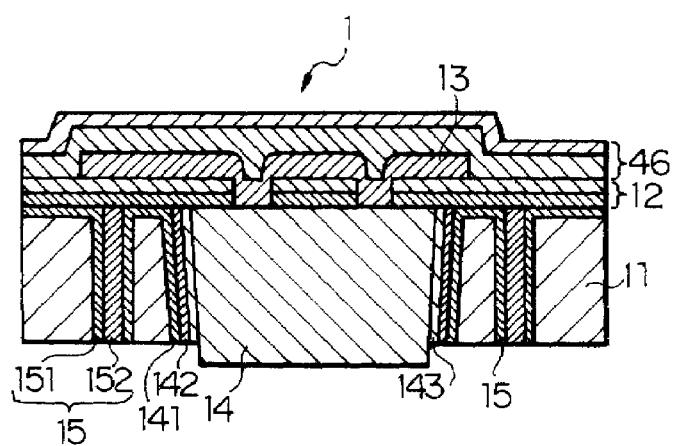

One preferred embodiment of a wiring substrate and a semiconductor device (e.g., a semiconductor integrated circuit device) of the present invention will be described with reference to FIGS. 1A and 1B. FIG. 1A is a diagram showing one example of the entire configuration of a semiconductor device of the present invention. FIG. 1B is a diagram showing in enlarged dimension the important part of a wiring substrate of the present invention.

Referring to FIG. 1A, a wiring substrate 1 of the invention connects at a first surface thereof to a mounting board (or referred to as a mother board) 2, and mounts an integrated circuit chip 3 on a second surface of the opposite side of the first surface. The connection between the wiring substrate 1 and the mounting board 2 is made through, for example, a ball solder, as a mounting board connecting portion 61. The connection between the wiring substrate 1 and the integrated circuit chip 3 is made by an electrode (a bump) 71 formed at the wiring substrate 1, and an electrode (a bump) 71 formed at the integrated circuit chip 3. Under fill 81 is sealed into the gap between the wiring substrate 1 and the integrated circuit chip 3, and in addition, mold resin 82 for coating and sealing the integrated circuit chip 3 is formed on the wiring substrate 1.

In the wiring substrate 1, at least a portion of a wiring layer 13 of the integrated circuit chip 3 is formed on a substrate 11 via an insulating layer 12, and there is disposed a conductive connecting portion 14 connecting to the wiring layer 13 and penetrating the substrate 11, and an insulating portion 15 is formed at the side of the connecting portion 14 so as to surround the connecting portion 14 via a portion of the substrate 11.

The wiring substrate 1 will next be described in detail. As shown in FIG. 1B, the wiring substrate 1 comprises the wiring substrate 11, a wiring layer 13 formed on the substrate 11 via an insulating layer 12, the conductive connecting portion 14, which is connected to the wiring layer 13 and formed so as to penetrate the substrate 11, and an insulating portion 15, which is formed annularly via a portion of the substrate 11 around the side of the connecting portion 14, and which penetrates the substrate 11. In addition, an insulating layer 16 for coating the wiring layer 13 is formed. The wiring layer 13 may be formed in multilayer, as shown in FIG. 1A.

For example, a silicon substrate is used as the substrate 11. The connecting portion 14 is composed of copper, for example, and in order to ensure insulating property between the connecting portion 14 and the substrate 11, an insulating film 141 for ensuring electrical insulating property and a barrier metal layer 142 for preventing copper diffusion are formed externally at the side surface of the connecting portion 14. The insulating portion 15 is formed annularly around the connecting portion 14 and so as to penetrate the substrate 11. In the insulating portion 15, an insulating film 151 is formed on an annular sidewall at the penetrating portion in the substrate 11, thereby ensuring insulting property to the substrate 11. For convenience in manufacturing, the insulating film 141 formed around the side of the connecting portion 14, and the insulating film 151 of the insulating portion 15 may be composed of the insulting film of the same layer. In the event that the insulating portion 15 cannot be buried by the insulating film 151, the unburied portion can be buried by a barrier metal layer 152 that is the same layer as the barrier metal layer 142, and a copper shield layer 153 that is the same layer as a copper shield layer 143 to be formed when forming the connecting portion 14. In the drawing, there is illustrated the configuration in which the barrier metal layer 152 is buried completely. The insulating portion 15 functions as polishing stopper in the polishing step of exposing the connecting portion 14 from the surface of the substrate 11. Therefore, the insulating portion 15 is most preferably composed only of the insulating film 141, and it is desirable to bury copper in the smallest width possible. It is also desirable that the diameter of the insulating portion 15 formed annularly is set to be greater than the region where it is expected that the solder bump will extend beyond the connecting portion 14.

Example 2

Preferred embodiments of the insulating portion 15 in the wiring substrate 1 of the present invention will next be described with reference to plan layout diagrams in FIGS. 2A to 2C. Although these are not cross sections, some components are hatched for convenience in viewing.

Figure 2A:
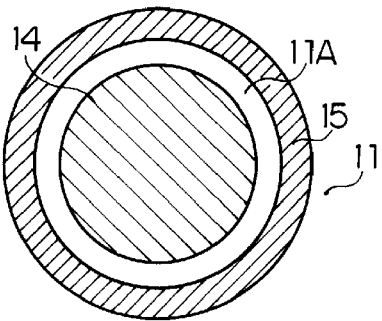
FIGS. 2A to 2C are plan layout drawings showing embodiments of an insulating portion in the wiring substrate of the present invention.

Referring to FIG. 2A, with respect to the connecting portion 14 formed so as to penetrate the substrate 11 in its thickness direction, the insulating portion 15 is formed annularly at the side of the connecting portion 14 via a portion 11A of the substrate 11, and so as to penetrate the substrate 11 in the thickness direction. Thus, if a solder bump (not shown), which is connected to the connecting portion 14, extends beyond the forming region of the connecting portion 14 and makes contact with the portion of the substrate 11 which is on the side of the connecting portion 14, the portion of the substrate 11, with which the solder bump makes contact, is surrounded by the annular insulating portion 15 arranged therearound. Consequently, there may arise no short circuit between the solder bump and the substrate 11.

Figure 2B:
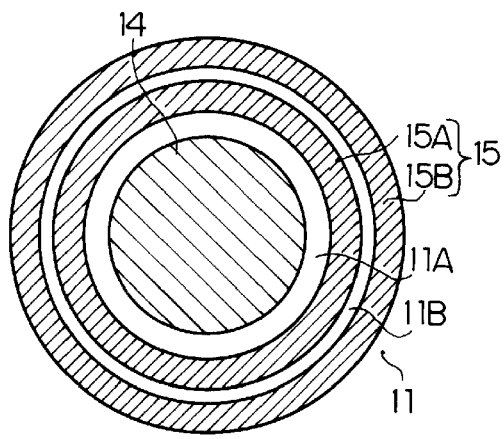

Referring to FIG. 2B, with respect to the connecting portion 14 formed so as to extend through the substrate 11 in its thickness direction, the insulating portion 15 is formed coaxially at the side of the connecting portion 14 via portions 11A and 11B of the substrate 11, and so as to penetrate the substrate 11 in the thickness direction. Specifically, an annular first insulating portion 15A is formed from the connecting portion 14 via the portion 11A, and an annular second insulating portion 15B is formed via the portion 11B of the substrate 11. Thus, if a solder bump (not shown), which is connected to the connecting portion 14, extends beyond the forming region of the connecting portion 14 and makes contact with the portion of the substrate 11 which is on the side of the connecting portion 14, the portion of the substrate 11, with which the solder bump makes contact, is surrounded by the annular insulating portion 15 arranged coaxially therearound, and hence there is no electrical connection with the portion of the substrate 11 which is at the outermost portion of the insulating portion 15. Consequently, there may arise no short circuit between the solder bump and the substrate 11.

Figure 2C:
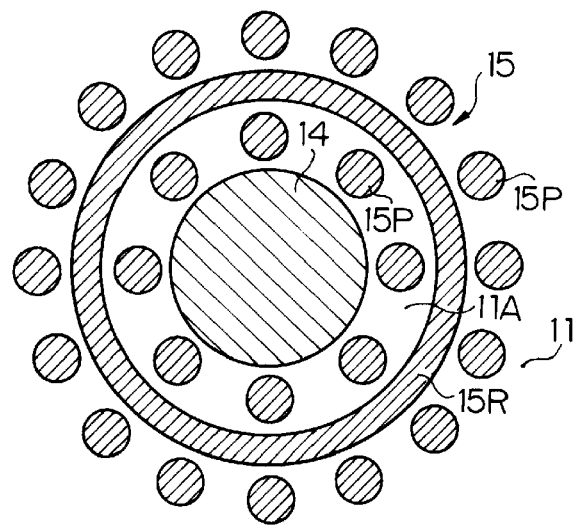

Referring to FIG. 2C, the insulating portion 15 consists of an annular insulating portion 15R and a plurality of columnar insulating portions 15P arranged annularly. With respect to the connecting portion 14 formed so as to penetrate the substrate 11 in its thickness direction, the annular insulating portion 15R is formed at the side of the connecting portion 14 via a portion 11A of the substrate 11 so as to penetrate the substrate 11 in the thickness direction. For example, a plurality of the columnar insulating portions 15P are arranged annularly on the inside and the outside of the annular insulating portion 15R, and each of the columnar insulating portions 15P is formed so as to penetrate in the thickness direction of the substrate 11. Thus, if a solder bump (not shown), which is connected to the connecting portion 14, extends beyond the forming region of the connecting portion 14 and makes contact with a portion of the substrate 11 which is on the side of the connecting portion 14, the portion of the substrate 11, with which the solder bump makes contact, is surrounded by the annular insulating portion 15, and hence there is no electrical connection with the portion of the substrate 11 which is on the outside of the insulating portion 15. Consequently, there may arise no short circuit between the solder bump and the substrate 11. In addition, when the substrate 11 is polished to expose the connecting portion 14 in the manufacturing step of forming the connecting portion 14 at the substrate 11, the annularly arranged columnar insulating portions 15P function as polishing stopper, thereby producing the effect of suppressing dishing and erosion as occurred with substrates in the conventional substrate polishing step.

Example 3

One preferred embodiment of a method of manufacturing a wiring substrate of the present invention will be described with reference to FIGS. 3A to 3I. Herein, the manufacturing steps of a wiring substrate (an interposer) of the present invention will be described by plotting their respective important parts.

Figure 3A:
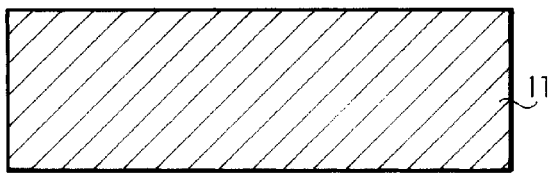
FIGS. 3A to 3I are explanatory drawings showing one preferred embodiment of a method of manufacturing a wiring substrate in the present invention.

Referring to FIG. 3A, there is prepared a substrate 11, which is a silicon substrate 11, for example.

Figure 3D:
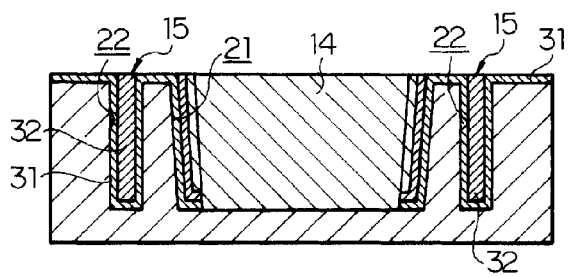
Figure 3B:
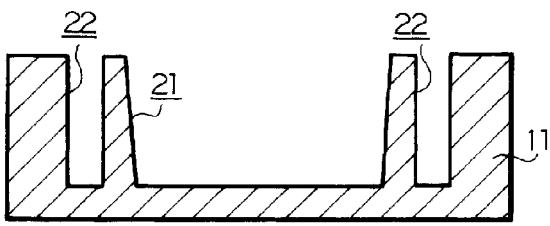

Referring to FIG. 3B, with photolithography technique and dry etching technique, etc., a hole 21 for forming a connecting portion in the silicon substrate 11 is formed, and an annular groove 22 is formed at the side of the hole 21 via a portion of the substrate 11. The depth of the hole 21 and that of a recess portion (hereinafter referred to as a groove) 22 are 20 μm to 1000 μm, and the diameter of the hole 21 is 10 μm to 500 μm. Herein, the depths of the hole 21 and the groove 22 are set to 200 μm, for example. The width of the groove 22 is 0.05 μm to 100 μm, and it is set to 5 μm, for example. The diameter of the groove 22 is set to be greater than, for example, the region where it is expected that a solder bump to be formed later will extend beyond the connecting portion.

The width of the groove 22 may be set at any value not less than the width in which an insulating film can be buried in the groove 22. One of the purposes for forming the groove 22 is to use the film buried in the groove 22 as a polishing stopper layer. Therefore, too large width of the groove 22 may cause copper serving as construction material of the connecting portion to be buried in the groove 22, so that the effect of a polishing stopper film becomes lessened. Preferably, the width of the groove 22 is determined such that no copper is buried in the groove 22.

Figure 4A:
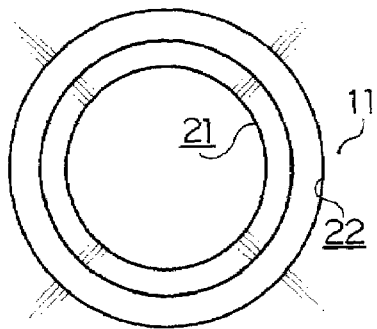
FIGS. 4A to 4C are plan layout drawings showing other embodiments of an insulating portion in the wiring substrate of the present invention.

The recess portion 22 can be formed in such a shape that an insulating portion is constructed as described with reference to FIGS. 2A to 2C. Specifically, as shown in FIG. 4A, the recess portion (groove) 22 can be formed at the side of the hole 21 in a single ring via a portion 11A of the substrate 11 and in the same depth as the hole 21.

Figure 4B:
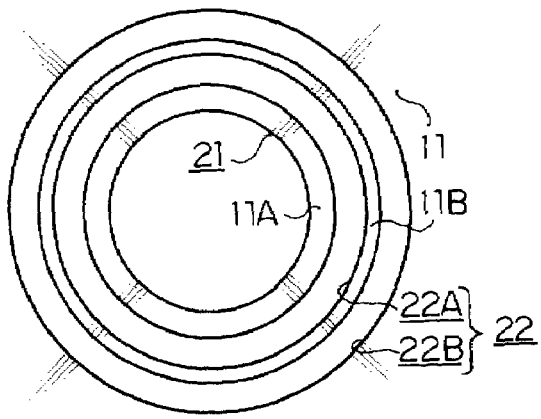

As shown in FIG. 4B, the recess portion (groove) 22 can be formed coaxially at the side of the hole 21 via portions 11A and 11B of the substrate 11 and in the same depth as the hole 21. Specifically, an annular first groove 22A is formed from the hole 21 via the portion 11A of the substrate 11, and an annular second groove 22B is formed via the portion 11B of the substrate 11.

Figure 4C:
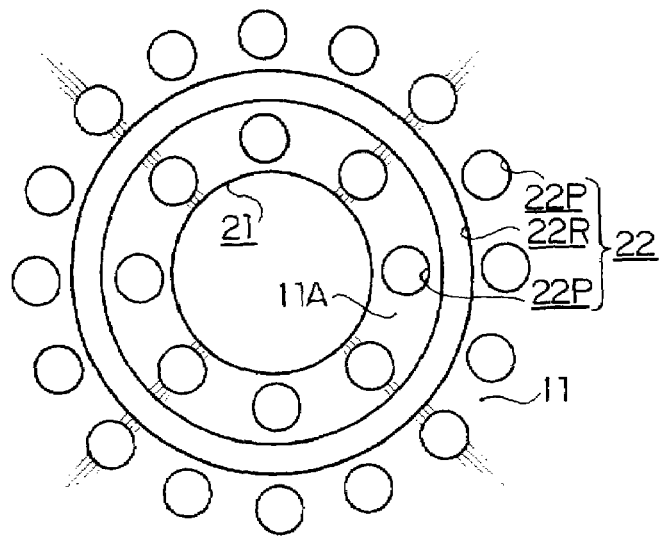

As shown in FIG. 4C, the recess portion 22 can also be formed by an annular groove 22R and a plurality of columnar holes 22P arranged annually. With respect to the hole 21, the annular groove 22R is formed at the side of the hole 21 via the portion 11A of the substrate 11 and in the same depth as the hole 21. A plurality of the columnar holes 22P are arranged annularly, for example, on the inside and the outside of the annular groove 22R. A single annular groove is sufficient for forming an insulating portion with the aim of retaining insulation in the event that a bump extends beyond a predetermined region. The aim of forming double or more grooves, or arranging annularly the holes 22P is to bury an insulating film in each groove or hole, and have the buried insulating film function as polishing stopper during the polishing for exposing the connecting portion from the substrate.

Figure 3E:
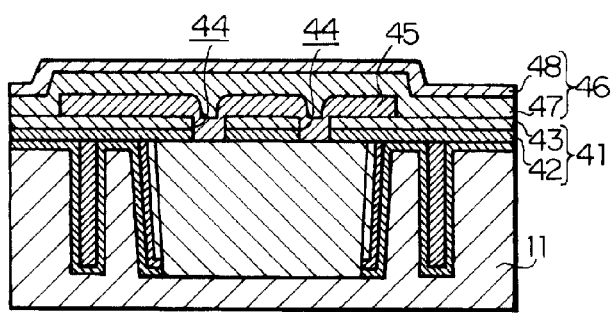
Figure 3C:
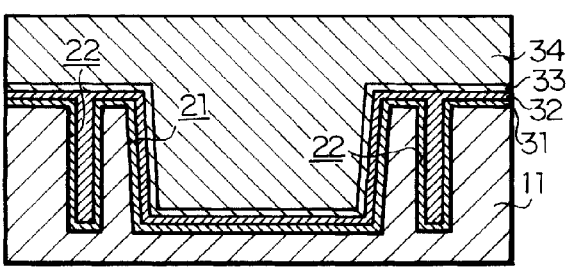

Referring to FIG. 3C, an insulating film 31, a barrier metal layer 32, a shield copper layer 33 are formed sequentially on the surface of the substrate 11, including the respective inner surfaces of the hole 21 and the groove 22. Further, by plating method, a copper plate layer 34 is formed so as to bury the hole 21 and the groove 22.

Then, the excessive conductive films in the copper plate layer 34, the shield copper layer 33, and the barrier metal layer 32 are removed by chemical mechanical polishing (hereinafter referred to as "CMP"), or the like.

Referring to FIG. 3D, a connecting portion 14 composed of copper is formed at the inside of the hole 21 via the insulating film 31 and the barrier metal layer 32, and with use of the insulating film 14, an insulating portion 15 is formed at the respective insides of the grooves 22. The insulating portion 15 may have at its center the barrier metal film 32. This is because the insulating film 31 is formed annularly along the sidewall of the grooves 22, so that the connecting portion 14 is insulated from the portion of the substrate 11 which is on the outside of the insulating portion 15. Although copper may be formed at the center of the insulating portion 15, it is desirable to bury no copper in the grooves 22, if optimum polishing stopper performance is to be achieved.

Referring to FIG. 3E, on the surface of the substrate 11, an insulating film 41 (corresponding to the insulating film 12 in FIGS. 1A and 1B) is formed in a laminate structure of a nitride silicon film 42 and an oxide silicon film 43, for example. Thereafter, by photolithography technique, drying etching technique, etc., a connecting hole 44 is opened in the insulating film 41, and then a wiring layer 45 (corresponding to the wiring layer 13 in FIGS. 1A and 1B) is formed. The wiring layer 45 is used for joining to a semiconductor transistor circuit, which is not described herein, and for forming a wiring circuit. The wiring layer 45 is obtained by forming a conductive layer, and patterning the conductive layer with photolithography technique, dry etching technique, etc. Subsequently, a protection insulating film 46 for coating the wiring layer 45 is formed. For example, the protection insulating film 46 is formed in a laminate structure of an oxide silicon film 47 and a nitride silicon film 48.

Figure 3F:
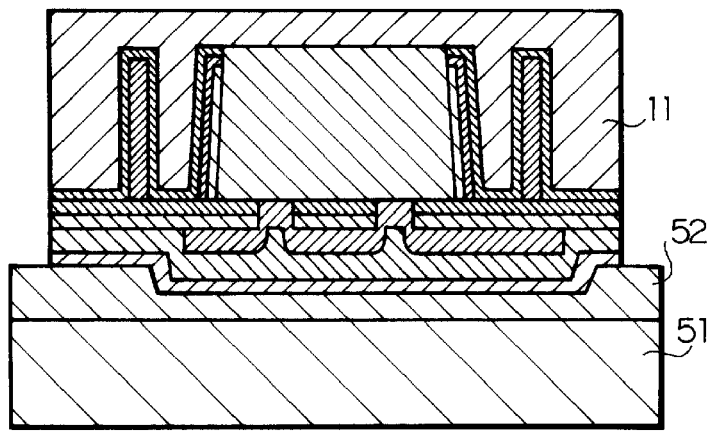

Referring to FIG. 3F, the substrate 11 is upside down, and adhered to a support substrate 51 with adhesion 52, for example.

Figure 3G:
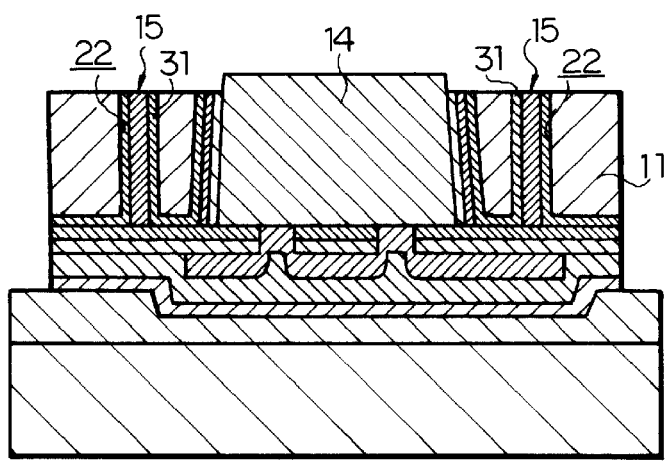

Referring to FIG. 3G, by grinding and polishing techniques, the bottom surface of the substrate 11 is removed in a thickness of several hundreds μm, thereby to expose the copper connecting portion 14 and the insulating portion 15. In polishing with CMP method, there is generally used abrasive having a high polishing rate of silicon that is construction material of the substrate 11. However, by using abrasive having a high selectivity of silicon and the insulting film 31 buried in the grooves 22, the insulting film 31 is usable as a stopper film.

Figure 3H:
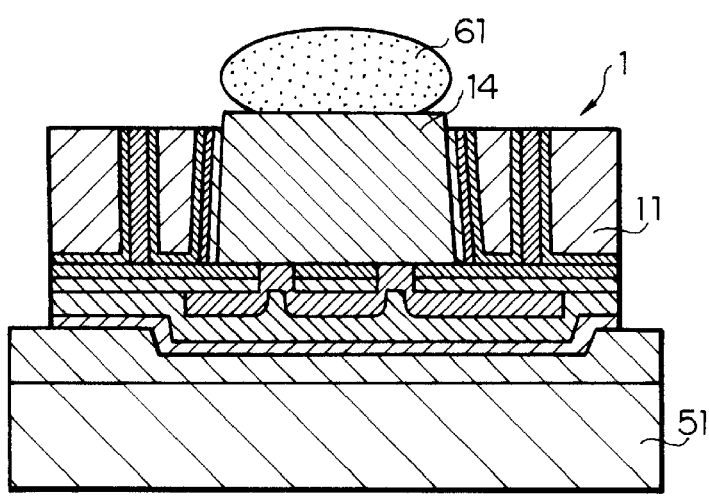

Referring to FIG. 3H, for example, a solder bump is formed as a mounting board connecting portion 61, which is connected to the connecting portion 14.

Subsequently, the substrate 11 so formed is cut individually by dicing, thereby to prepare a wiring substrate (an interposer) 1. The support substrate 51 is then removed from the substrate 11.

Figure 3I:
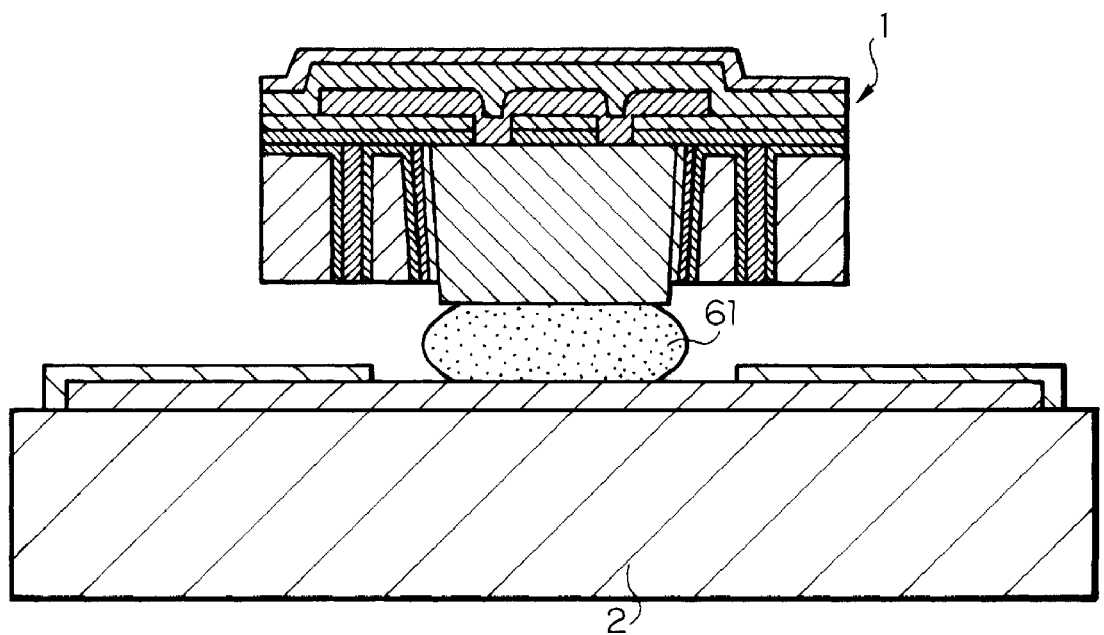

Referring to FIG. 3I, the wiring substrate 1 is joined via the mounting board connecting portion 61 to a mounting board (a mother board) 2.

Thereafter, although not being plotted, an electrode connected to the wiring layer 45 formed on the wiring substrate 1 is formed, and then a semiconductor integrated circuit chip is connected to the electrode. Alternatively, before or after the substrate 11 is adhered to the support substrate 51, an electrode may be formed on the wiring layer 45 formed on the substrate 11, and after a semiconductor integrated circuit chip is joined to the electrode, the wiring substrate 1 is joined to the mounting board 2 in the above-mentioned step. As above described with reference to FIGS. 1A and 1B, under fill 81 is filled into the gap between the wiring substrate 1 and the integrated circuit chip 3, and the integrated circuit chip 3 is further sealed with mold resin 82.

Thus, the semiconductor device 4 described with reference to FIGS. 1A and 1B is completed by the foregoing manufacturing method.

Figure 5:
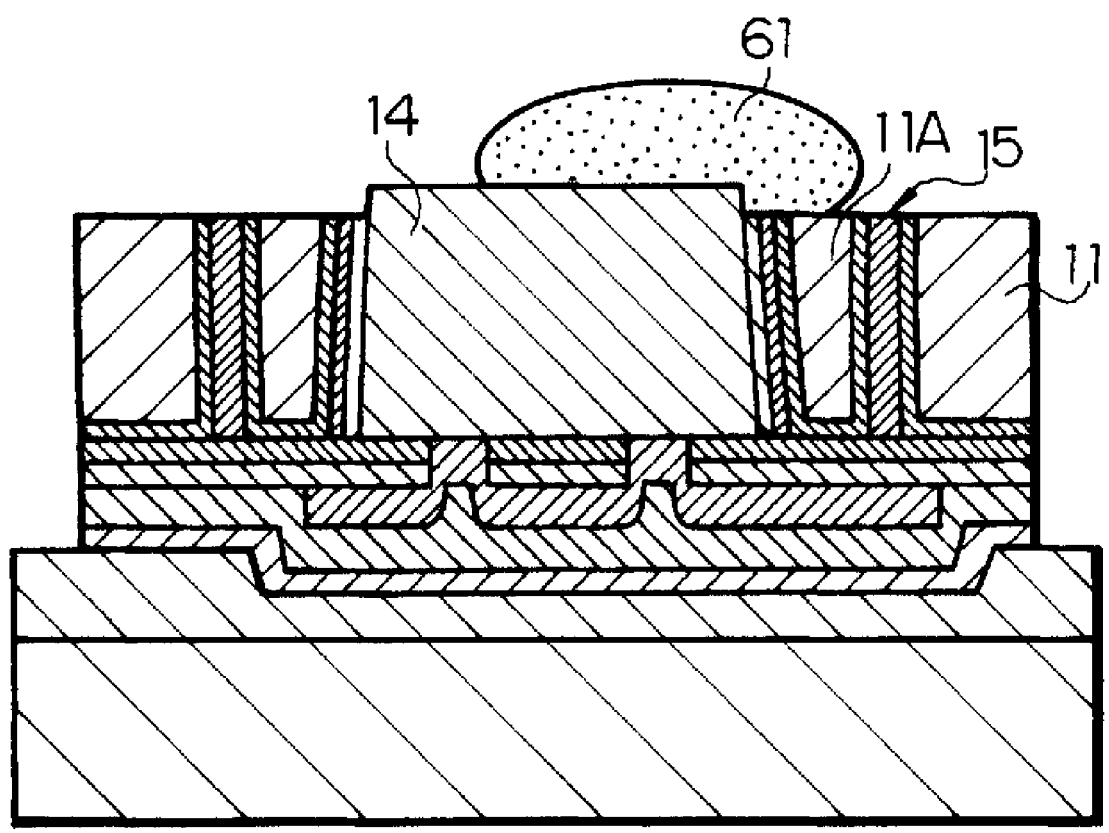
FIG. 5 is a schematic structural sectional view for explaining the effect of the wiring substrate of the present invention.
Figure 6F:
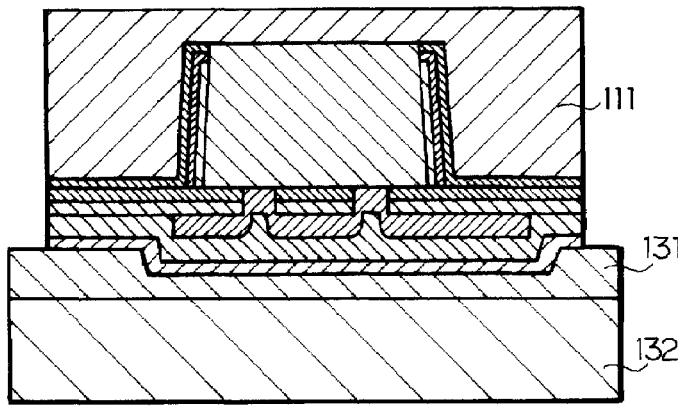
Figure 6G:
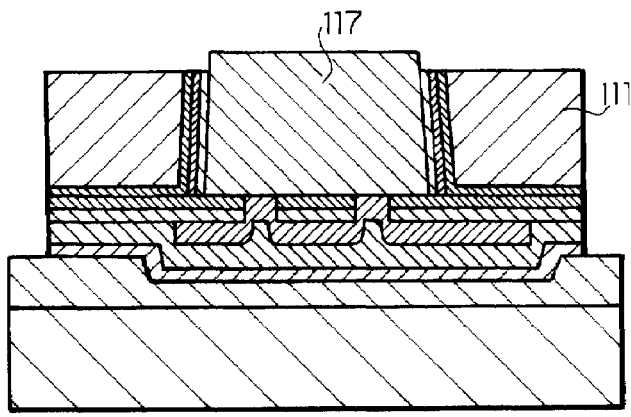
Figure 6H:
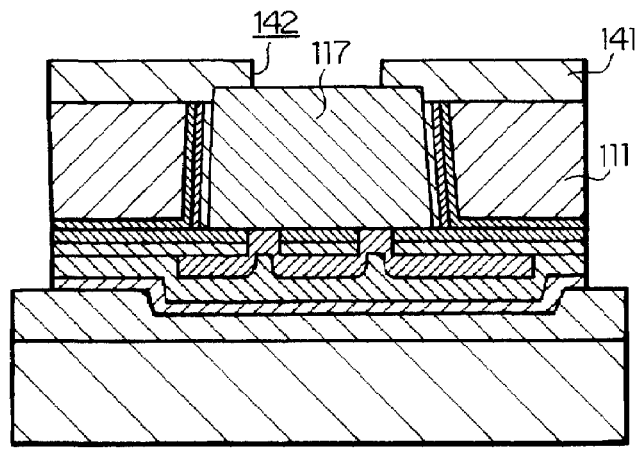
Figure 6I:
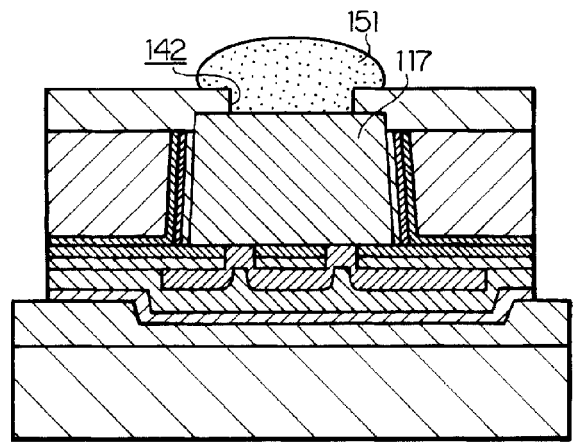
Figure 6J:
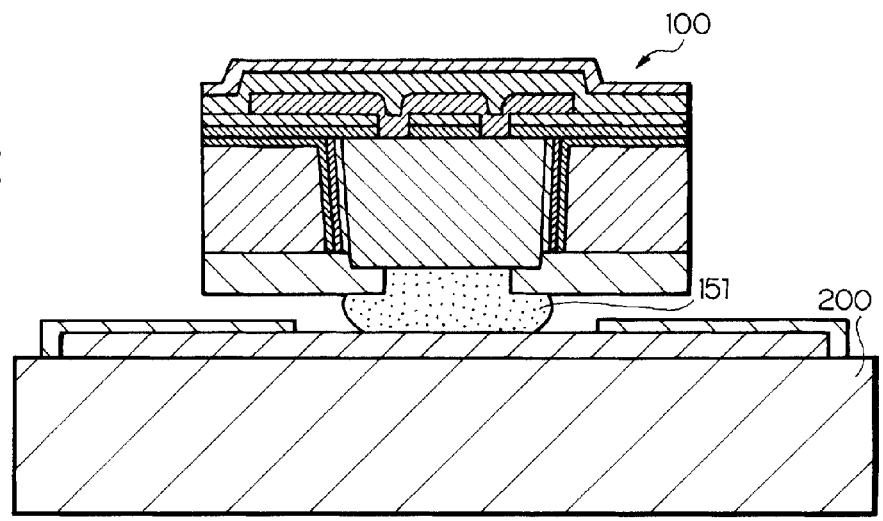
Figure 7A:
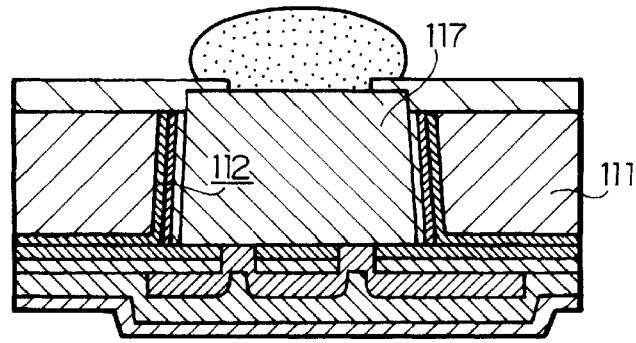
FIGS. 7A to 7C are schematic structural sectional views showing the problems of the conventional wiring substrate.
Figure 7B:
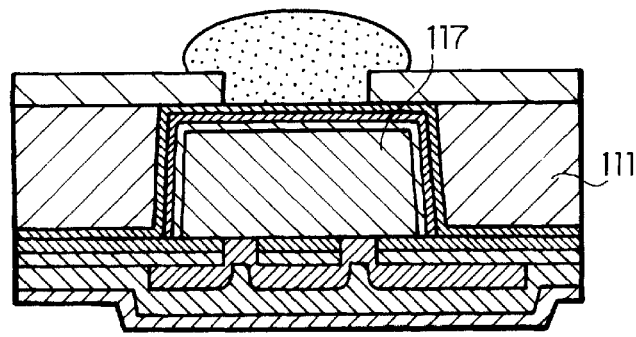
Figure 7C:
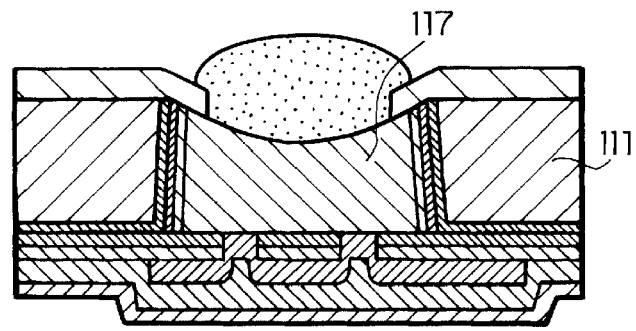
Figure 8:
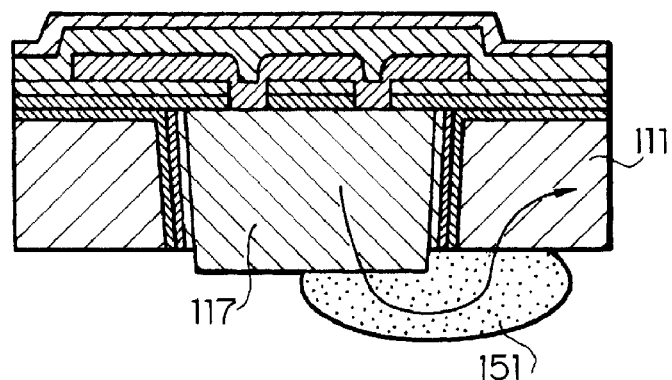
FIG. 8 is a schematic structural sectional view for explaining the problems of the conventional wiring substrate.

Referring to FIG. 5, in accordance with the wiring substrate and the manufacturing method of the same in the present invention, if the solder bump composing the mounting board connecting portion 61 deviates relative to the connecting portion 14, and makes contact with the substrate portion 11A at the side of the connecting portion 14, the portion 11A of the substrate, with which the mounting board connecting portion 61 makes contact, is insulated from other portions of the substrate 11 by the insulating portion 15. Consequently, there may arise no short circuit between the portion of the substrate 11 which is on the outside of the insulating portion 14 and the mounting board connecting portion 61.

The wiring substrate, the method of manufacturing the wiring substrate, and the semiconductor device in the present invention are suitably used for applications of SiP technique.

The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

What is claimed is:

1. A method for manufacturing a wiring substrate for connecting a mounting board on one surface thereof and mounting an integrated circuit chip on the opposite surface to said one surface, said method comprising the steps of:
    forming a hole in a first surface of said wiring substrate suitable for a conductive connecting portion penetrating said wiring substrate to connect at least a portion of a wiring layer to said integrated circuit chip, said portion of the wiring layer being on said first surface of said wiring substrate;
    forming an annular recess portion in first surface of said substrate around said hole so as to surround said hole; and
    depositing an insulating film over said first surface of said substrate so as to cover inner sidewalls of said hole and said recess,
    depositing a metal film layer over first surface of said substrate so as to fill up said recess and cover said inner sidewalls of said hole,
    depositing a shield copper layer over said first surface of said substrate so as to cover said metal film layer and said inner sidewalls of said hole,
    depositing a conductive layer over said first surface of said substrate so as to fill said hole
    removing portions of said conductive layer and said shield copper layer on said first surface,
    providing said wiring on said first surface of said substrate, and
    removing a portion of a second surface of said substrate so as to leave a portion of said conductive layer in said hole protruding from said second surface, said protruding conductive layer effective as a connecting portion,
    wherein,
    a width of said annular recess is such that an insulating film can be buried in the recess but said copper layer cannot penetrate said recess.

2. The method for manufacturing a wiring substrate according to claim 1, wherein said recess is concentric with said hole.

3. The method for manufacturing a wiring substrate according to claim 1, wherein said step of forming said annular recess comprises forming a plurality of annular recess about said hole.

4. The method for manufacturing a wiring substrate according to claim 1, further comprising the step of forming a plurality of plurality of holes about said hole in which said conductive penetrating portion is formed.

* * * * *